United States Patent
Ng et al.

(10) Patent No.: US 11,804,846 B2
(45) Date of Patent: Oct. 31, 2023

(54) PHASE-LOCKED LOOP WITH PHASE INFORMATION MULTIPLICATION

(71) Applicant: Cadence Design Systems, Inc., San Jose, CA (US)

(72) Inventors: George Chung Fai Ng, Markham (CA); Marcus Van Ierssel, Toronto (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/674,569

(22) Filed: Nov. 5, 2019

(65) Prior Publication Data
US 2020/0145013 A1    May 7, 2020

Related U.S. Application Data

(60) Provisional application No. 62/755,624, filed on Nov. 5, 2018.

(51) Int. Cl.
*H03L 7/089* (2006.01)
*H03L 7/099* (2006.01)

(52) U.S. Cl.
CPC ............ *H03L 7/0891* (2013.01); *H03L 7/099* (2013.01)

(58) Field of Classification Search
CPC ........................................................ H03L 7/089
See application file for complete search history.

(56) References Cited

U.S. PATENT DOCUMENTS

| | | | | |
|---|---|---|---|---|
| 6,583,675 B2* | 6/2003 | Gomez | ............... | H03B 5/1278 331/8 |
| 8,633,777 B2* | 1/2014 | Jin | ........................ | H01L 23/645 331/117 FE |
| 9,948,313 B1* | 4/2018 | Rafi | ....................... | H03L 7/193 |
| 2008/0265957 A1* | 10/2008 | Luong | ..................... | H03L 7/089 327/156 |
| 2014/0203853 A1* | 7/2014 | Hsueh | ....................... | H03L 7/10 327/157 |
| 2015/0214966 A1* | 7/2015 | Tong | ..................... | H03L 7/0898 327/157 |

* cited by examiner

*Primary Examiner* — Ryan Johnson
*Assistant Examiner* — Colleen J O Toole
(74) *Attorney, Agent, or Firm* — Mark Whittenberger, Esq; Holland & Knight LLP

(57) ABSTRACT

A phase-locked loop (PLL) includes a phase-frequency detector that compares a reference signal to a feedback signal. The difference in phase between the reference signal and the feedback signal is encoded as digital pulses on one or more outputs of the phase-frequency detector. The digital output pulses from the phase-frequency detector are duplicated and delayed multiple times in a non-overlapping manner before being input to the loop filter or voltage controlled oscillator (VCO) of the PLL.

20 Claims, 13 Drawing Sheets

PHASE-LOCKED LOOP WITH PHASE INFORMATION MULTIPLICATION

DETAILED DESCRIPTION OF THE EMBODIMENTS

Phase-locked loops (PLLs) are control systems that generate output signals whose phase is related (e.g., shifted, frequency multiplied, etc.) to the phase of a reference input signal. Phase-locked loops can be, for example, used to demodulate a signal (e.g., a frequency modulated signal), recover a signal from a noisy communication channel, generate a stable frequency at multiples of an input frequency (a.k.a., frequency synthesis), clock recovery, clock-data deskewing, and to distribute precisely timed clock pulses (e.g., to parts of an integrated circuit.)

In some PLL applications, phase events on the reference input signal occur relatively infrequently when compared to the output signal. For example, in a frequency synthesis/multiplication application, the reference input signal may transition only once in a given period of time while the output signal transitions thousands of times over the same period. In these situations, the PLL control loop has a low response bandwidth as compared to the output frequency.

In an embodiment, a phase-locked loop (PLL) includes a phase-frequency detector that compares a reference signal to a feedback signal. The difference in phase between the reference signal and the feedback signal is encoded as digital pulses on one or more outputs of the phase-frequency detector. The digital output pulses from the phase-frequency detector are duplicated multiple times in a non-overlapping manner before being input to the loop filter or voltage controlled oscillator (VCO) of the PLL. This repetition of phase information can increase the bandwidth of the phase-locked loop without necessarily making changes to the digital logic levels, supply voltage, VCO capacitance/inductance, etc.

Figure 1:
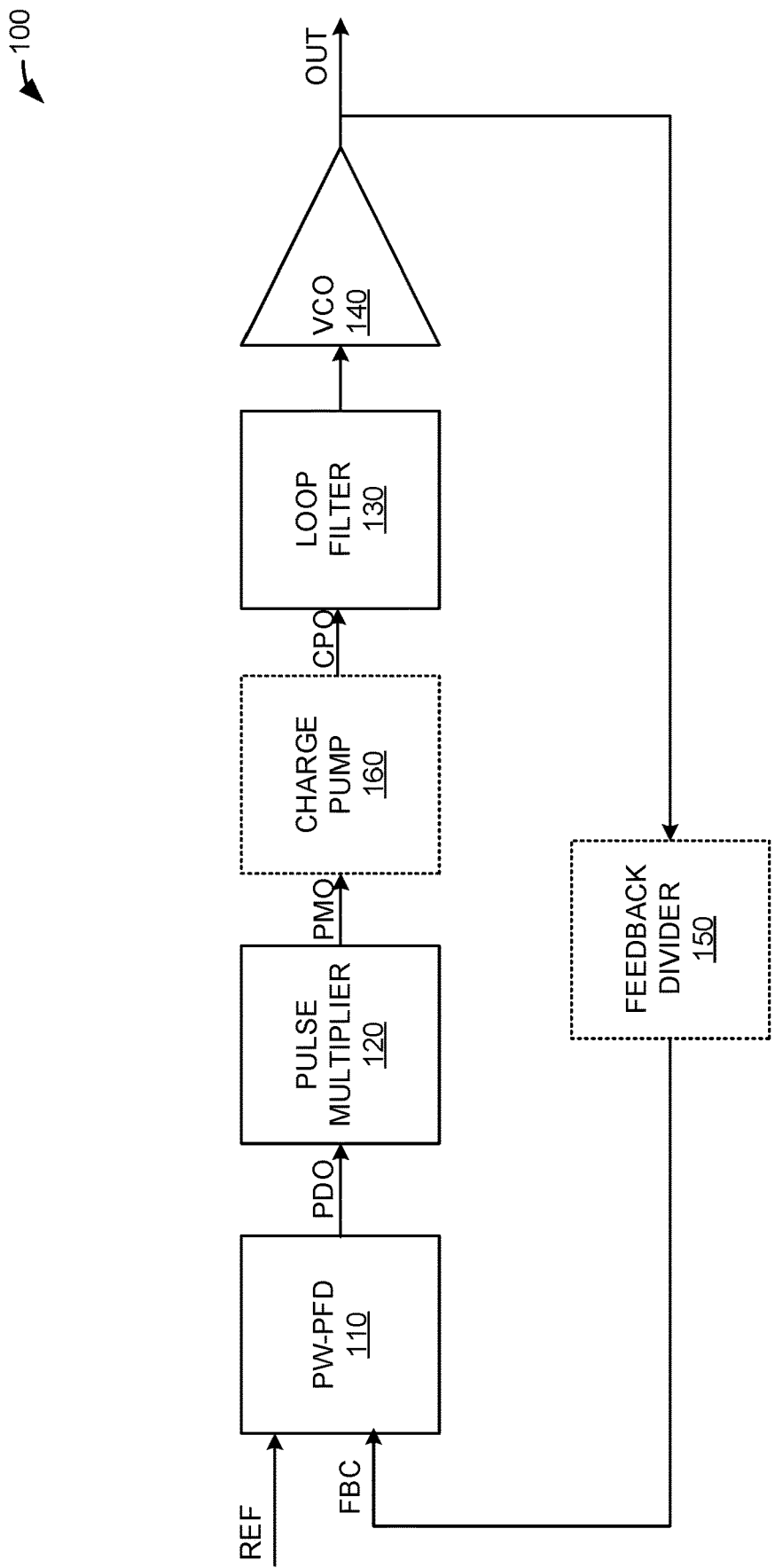
FIG. 1 is a block diagram illustrating a phase-locked loop configuration with phase information multiplication.

FIG. 1 is a block diagram illustrating a phase-locked loop with phase information multiplication. In FIG. 1, phase-locked loop configuration 100 comprises pulse-width output phase-frequency detector (PW-PFD or PFD)) 110, pulse multiplier (PM) 120, loop filter (LF) 130, voltage-controlled oscillator (VCO) 140, (optionally) feedback divider 150, and (optionally) charge pump 160.

Pulse-width phase-frequency detector 110 receives a reference signal (REF) and a feedback compare signal (FBC). PW-PFD 110 operates to compare the phase of the reference signal (REF) to the feedback compare signal (FBC) and, based on that comparison, generate one or more signals that correspond the difference in phase between the two signals (e.g., both magnitude of phase difference and direction of phase difference—i.e., early or late). In an embodiment, PW-PFD 110 outputs digital pulses that convey information about the phase difference between the input reference signal (REF) and the feedback compare signal (FBC). The pulses output by PW-PFD 110 are carried on one or more phase-detector output (PDO) signals.

In an embodiment, PW-PFD 110 outputs pulses whose width corresponds to the phase difference between the reference signal (REF) the feedback compare signal (FBC). For example, if a particular edge of the reference signal (REF) arrives at PW-PFD 110 an amount of time (ΔT) before the corresponding edge of the feedback compare signal (FBC), PW-PFD 110 may output a pulse that is (effectively) the same amount of time, ΔT. Thus, the earlier the reference signal (REF) arrives when compared to the feedback compare signal (FBC), the longer the pulse that is output by PW-PFD 110. Accordingly, in this example, the length of the pulses output by PW-PFD 110 convey information about the amount of phase difference between REF and FBC.

One or more phase-detector output signals (PDO) are input to pulse multiplier 120. Pulse multiplier 120 duplicates and offsets in time the digital pulses output by phase-frequency detector 110. Pulse multiplier 120 duplicates the digital pulses output by phase-frequency detector 110 and offsets the duplicates (or optionally the originals) in time from the original pulses such that the duplicated pulses do not overlap with the original (input) pulses, other duplicated pulses, or the next pulse to be output by phase-frequency detector 110. The pulses output by pulse multiplier 120 are carried on one or more pulse multiplier output (PMO) signals. By multiplying the digital pulses output by phase-frequency detector 110, the effect of the phase information carried by a single pulse is likewise multiplied. This effectively increased the proportional gain of the PLL 100 feedback loop without modifying the other components.

The pulse multiplier 120 output pulses on PMO are provided to charge pump 160, if present. The output of charge pump 160 (CPO), if present, is provided to loop filter 130. Charge pump 160 receives the pulses output by pulse multiplier 120 and converts them to a current and/or voltage that is suitable for loop filter 130. If charge pump 160 is not present, pulse multiplier output pulses on PMO are provided directly to loop filter 130. Thus, if charge pump 160 is not present, loop filter 130 is adapted (e.g., by using digital logic, an internal charge pump, switched capacitors, digital filtering, etc.) to receive the pulses from pulse multiplier 120 directly. The output of loop filter 130 controls the frequency of the signal (OUT) output by VCO 140. In an embodiment, loop filter 130 may be part of VCO 140. The output of VCO 140 (OUT) is typically the output of phase-locked loop configuration 100.

VCO 140 may comprise voltage controlled capacitors that are part of an inductance-capacitance resonant circuit (a.k.a., LC circuit, LC tank circuit, LC tuned circuit, etc.) The bias voltage on one or more voltage controlled capacitors of VCO 140 may be based on the signal received from loop filter 130 (and/or pulse multiplier 120.)

VCO 140 may comprise capacitors that are selectively switched in and out of an inductance-capacitance resonant circuit. These capacitors may be selectively switched in to, and out of, the inductance-capacitance resonant circuit based on digital control signals. These digital control signals may be based on one or more analog and/or digital values received from loop filter 130 and/or pulse multiplier 120.

The output of VCO 140 (OUT) is fed back to the input of phase-frequency detector 110. Optionally, the frequency of the output of VCO 140 may be divided down to a lower frequency by feedback divider 150. The output of feedback divider 150, when present, is feedback compare signal, FBC. When feedback divider 150 divides by 1, the frequency of FBC is the same as the frequency of OUT. When feedback divider 150 is not present at all, the feedback compare signal FBC is also the output of VCO 140 (OUT).

Figure 2:
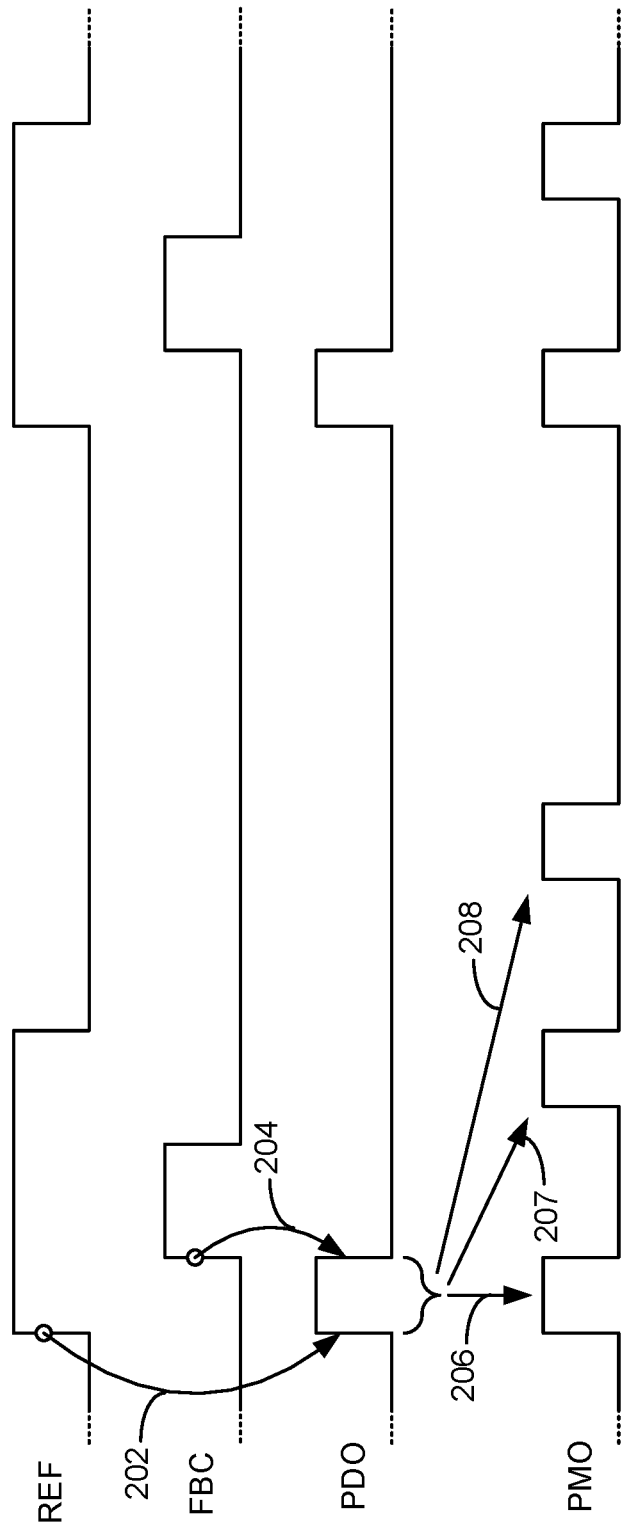
FIG. 2 is a waveform illustration of phase information multiplication.

FIG. 2 is a waveform illustration of phase information multiplication. The waveforms illustrated in FIG. 2 may correspond to one or more signals of phase-locked loop configuration 100. In FIG. 2, the rising edge of a reference signal (REF) leads the rising edge of a feedback compare signal (FBC). In other words, the feedback compare signal (FBC) has a later phase than the reference signal. The amount of phase difference (i.e., phase information) between the reference signal (REF) and the feedback compare signal (FBC) is reflected by a pulse on the PDO signal (e.g., an output from PW-PFD 110.) The width of the pulse on the PDO signal (i.e., phase information) is determined by the difference in time (i.e., phase) between the rising edge of REF and the rising edge of FBC. This is illustrated in FIG. 2 by arrows 202 and 204.

In FIG. 2, the pulse on the PDO signal is output three times on the signal PMO (e.g., an output from pulse multiplier 120.) This is an example number of replications/duplications. It should be understood that the maximum number of output pulses is determined by the maximum pulse duration and period of the reference signal (REF). The pass-through and/or replication of the pulses on the PDO signal is illustrated in FIG. 2 by arrows 206-208.

Figure 3:
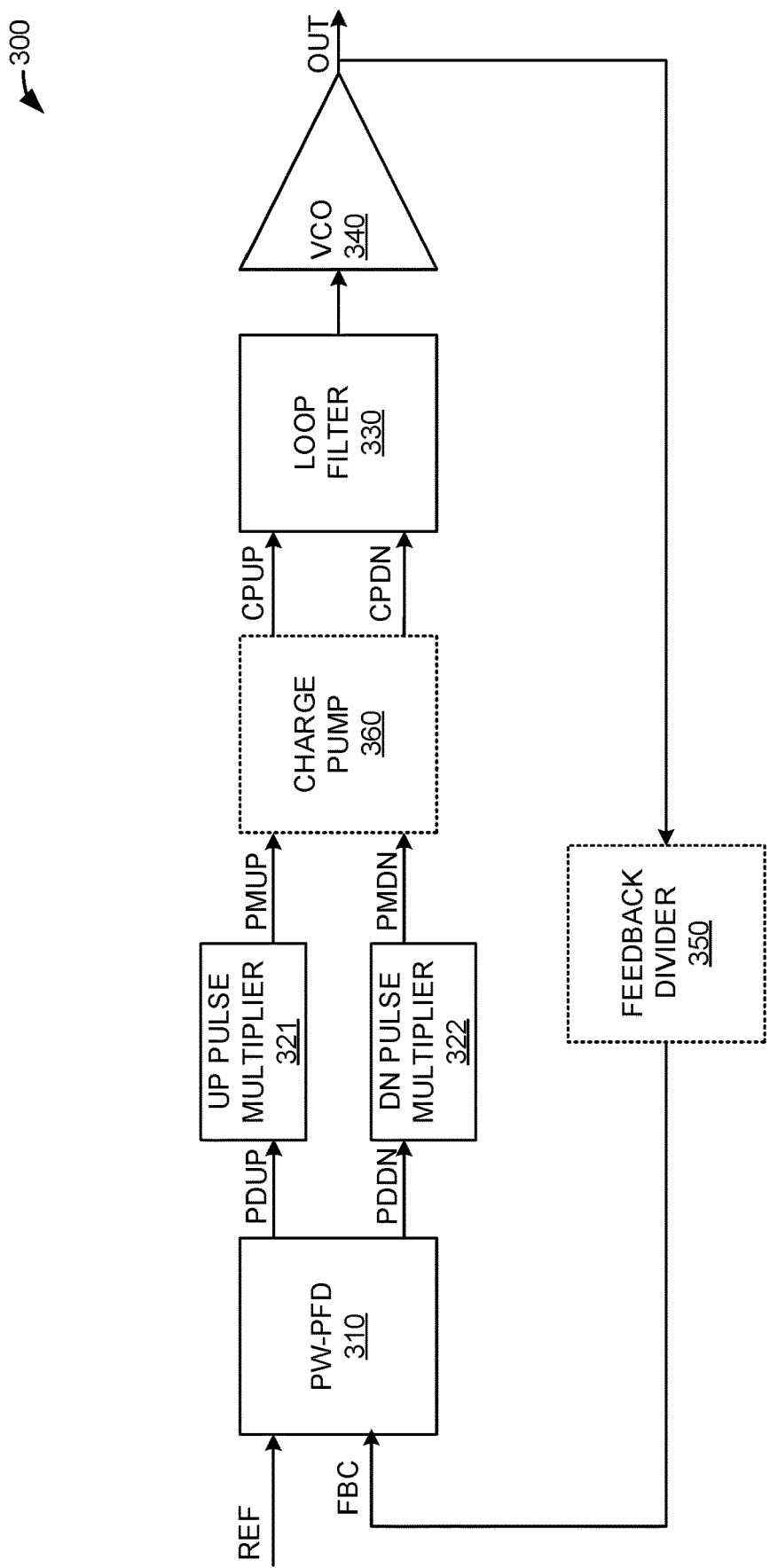
FIG. 3 is a block diagram illustrating a phase-locked loop configuration with late/early pulse multiplication.

FIG. 3 is a block diagram illustrating a phase-locked loop configuration with late/early pulse multiplication. In FIG. 3, phase-locked loop configuration 300 comprises pulse-width output phase-frequency detector (PW-PFD or PFD) 310, up pulse multiplier (PM) 321, down pulse multiplier 322, loop filter (LF) 330, voltage-controlled oscillator (VCO) 340, (optionally) feedback divider 350, and (optionally) charge pump 360.

Pulse-width phase-frequency detector 310 receives a reference signal (REF) and a feedback compare signal (FBC). PW-PFD 310 operates to compare the phase of the reference signal (REF) to the feedback compare signal (FBC) and, based on that comparison, generate signals PDUP and PDDN that correspond the difference in phase between the two signals (i.e., PDUP and PDDN, collectively convey the magnitude of phase difference and direction of phase difference—i.e., early or late). In an embodiment, PW-PFD 310 outputs digital pulses on PDUP and PDDN that convey information about the phase difference between the input reference signal (REF) and the feedback compare signal (FBC).

The pulses output by PW-PFD 310 are carried on PDUP and PDDN. For example, when the reference signal (REF) is earlier than the feedback compare signal (FBC), PW-PFD 310 will output at least one pulse on the PDUP signal that leads (or is longer than, or both) the pulse on the PDDN by an amount that is equal to, or proportional to, or corresponds to, the amount of time the reference signal (REF) leads the feedback compare signal (FBC). Likewise, when the reference signal (REF) is later than the feedback compare signal (FBC), PW-PFD 310 will output at least one pulse on the PDDN signal that leads (or is longer than, or both) the pulse on the PDUP by an amount that is equal to, or proportional to, or corresponds to, the amount of time the reference signal (REF) lags the feedback compare signal (FBC). Thus, PW-PFD 310 outputs pulses on PDUP and PDDN that convey information corresponding to the phase difference between the reference signal (REF) the feedback compare signal (FBC).

In an embodiment, the pulses on both signals PDUP and PDDN may have a minimum pulse width, and extra width is added to one of them to indicate the phase difference and lag/lead. Thus, in this embodiment, the phase difference is conveyed by the difference between the two pulse widths. In other words, PW-PFD 310 outputs pulses on PDUP and PDDN whose lengths convey the phase difference between the reference signal (REF) the feedback compare signal (FBC)—but are not equal to the amount of phase difference. The phase difference is conveyed by the difference between the two pulse widths on PDUP and PDDN. In another embodiment where there is no minimum pulse width on PDUP and PDDN, the signal the pulses appear on, PDUP or PDDN, may convey the direction (early or late) of the phase difference.

For example, if a particular edge of the reference signal (REF) arrives at PW-PFD 310 an amount of time (ΔT) before the corresponding edge of the feedback compare signal (FBC), PW-PFD 310 may output a pulse that is (effectively) the same amount of time, ΔT on PDUP (or a minimum length pulse that is increased by ΔT.) Thus, the earlier the reference signal (REF) arrives when compared to the feedback compare signal (FBC), the longer the pulse that is output by PW-PFD 310 on PDUP. Likewise, if a particular edge of the reference signal (REF) arrives at PW-PFD 310 an amount of time (ΔT) after the corresponding edge of the feedback compare signal (FBC), PW-PFD 310 may output a pulse that is (effectively) the same amount of time, ΔT on PDDN (or a minimum length pulse that is increased by ΔT). Thus, the later the reference signal (REF) arrives when compared to the feedback compare signal (FBC), the longer the pulse that is output by PW-PFD 310 on PDDN. Accordingly, in this example, the length of the pulses output by PW-PFD 310 on PDUP and PDDN convey information about the amount of phase difference between REF and FBC.

The PDUP phase-detector output signal is input to up pulse multiplier 321. Up pulse multiplier 321 duplicates and offsets in time the pulses on PDUP output by phase-frequency detector 310. Up pulse multiplier 321 duplicates the digital pulses on PDUP output by phase-frequency detector 310 and offsets the duplicates (or optionally the originals) in time from the original pulses such that the duplicated pulses on PDUP do not overlap with the original (input) pulses, other duplicated pulses on PDUP, or the next PDUP pulse to be output by phase-frequency detector 310.

Likewise, The PDDN phase-detector output signal is input to down pulse multiplier 322. Down pulse multiplier 322 duplicates and offsets in time the pulses on PDDN output by phase-frequency detector 310. Down pulse multiplier 322 duplicates the digital pulses on PDDN output by phase-frequency detector 310 and offsets the duplicates (or optionally the originals) in time from the original pulses such that the duplicated pulses on PDDN do not overlap with the original (input) pulses, other duplicated pulses on PDDN, or the next PDDN pulse to be output by phase-frequency detector 310.

The pulses output by up pulse multiplier 321 are carried on one or more up pulse multiplier output (PMUP) signals. By multiplying the up direction digital pulses output by phase-frequency detector 310, the effect of the phase information carried by a single up direction pulse is likewise multiplied. This can effectively increase the proportional gain of the PLL 300 feedback loop without necessarily requiring modification of the other components.

Likewise, the pulses output by down pulse multiplier 322 are carried on one or more down pulse multiplier output (PMDN) signals. By multiplying the down direction digital pulses output by phase-frequency detector 310, the effect of the phase information carried by a single down direction pulse is likewise multiplied. This can effectively increase the proportional gain of the PLL 300 feedback loop without necessarily requiring modification of other components.

The pulse multiplier output pulses on PMUP and PMDN are provided to charge pump 360, if present. The outputs of charge pump 360 (CPUP, CPDN), if present, are provided to loop filter 330. Charge pump 360 receives the pulses output by up pulse multiplier 321 and down pulse multiplier 322. Charge pump 360 converts the pulses on PMUP and PMDN to currents and/or voltages on CPUP and CPDN that are suitable for loop filter 330. If charge pump 360 is not present, the pulse multiplier output pulses on PMUP and PMDN are provided directly to loop filter 330. Thus, if charge pump 360 is not present, loop filter 330 is adapted (e.g., by using digital logic, an internal charge pump, switched capacitors, digital filtering, etc.) to receive the pulses from up pulse multiplier 321 and down pulse multiplier 322 directly. The output of loop filter 330 controls the frequency of the signal (OUT) output by VCO 340. In an embodiment, loop filter 330 may be part of VCO 340. The output of VCO 340 (OUT) is typically the output of phase-locked loop configuration 300.

VCO 340 may comprise voltage controlled capacitors that are part of an inductance-capacitance resonant circuit (a.k.a., LC circuit, LC tank circuit, LC tuned circuit, etc.) The bias voltage on one or more voltage controlled capacitors of VCO 340 may be based on the signals received from loop filter 330 (and/or pulse multipliers 321-322.)

VCO 340 may comprise capacitors that are selectively switched in and out of an inductance-capacitance resonant circuit. These capacitors may be selectively switched in to, and out of, the inductance-capacitance resonant circuit based on digital control signals. These digital control signals may be based on one or more analog and/or digital values received from loop filter 330 and/or pulse multipliers 321-322.

The output of VCO 340 (OUT) is fed back to the input of phase-frequency detector 310. Optionally, the frequency of the output of VCO 340 may be divided down to a lower frequency by feedback divider 350. The output of feedback divider 350, when present, is feedback compare signal, FBC. When feedback divider 350 divides by 1, the frequency of FBC is the same as the frequency of OUT. When feedback divider 350 is not present at all, the feedback compare signal FBC is also the output of VCO 340 (OUT).

Figure 4A:
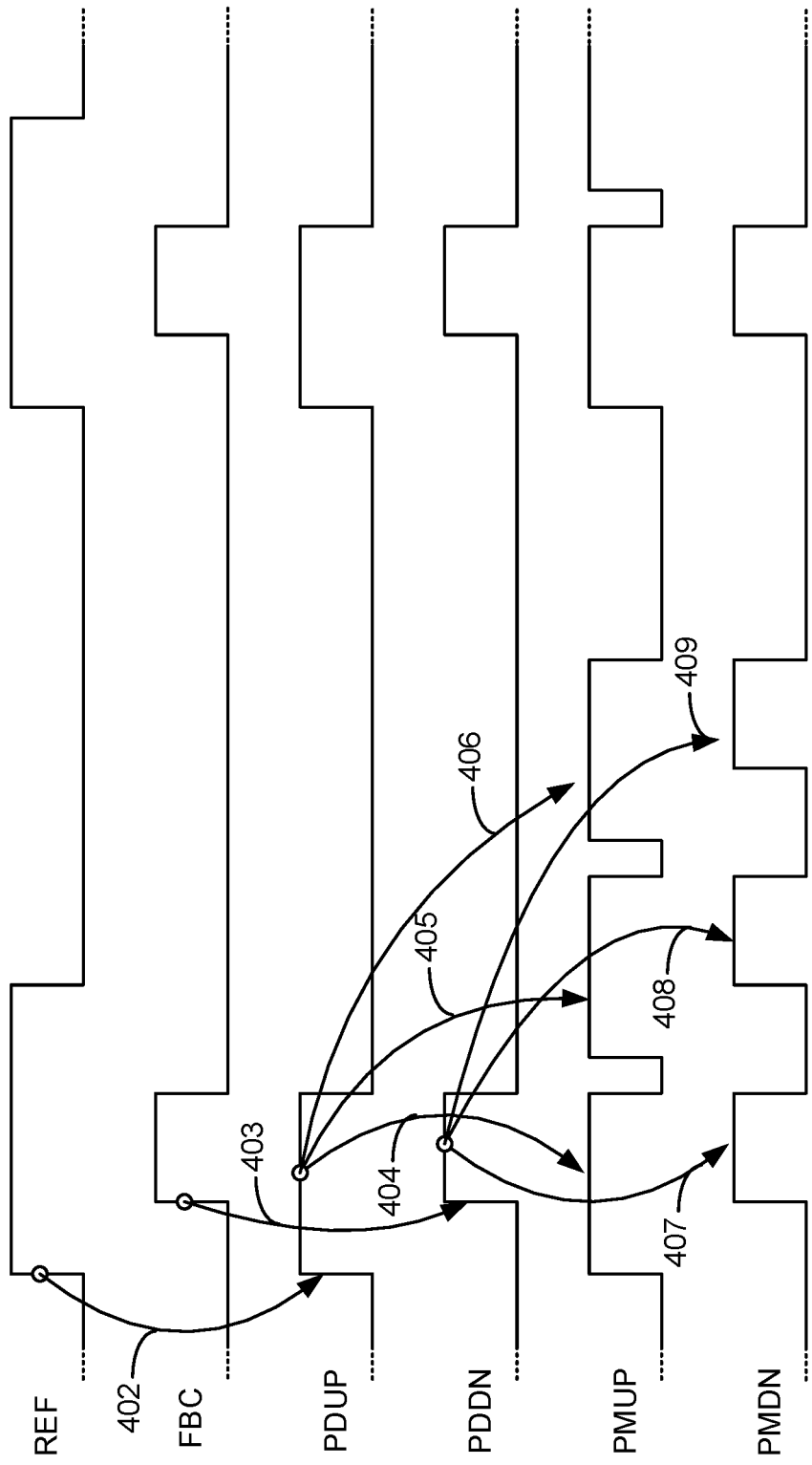
FIG. 4A is a waveform illustration of late/early pulse multiplication.

FIG. 4A is a waveform illustration of late/early pulse multiplication. The waveforms illustrated in FIGS. 4A and 4B may correspond to one or more signals of phase-locked loop configuration 300. In FIG. 4A, the rising edge of a reference signal (REF) leads the rising edge of a feedback compare signal (FBC). In other words, the feedback compare signal (FBC) has a later phase than the reference signal. The amount of phase difference (i.e., phase information) between the reference signal (REF) and the feedback compare signal (FBC) is reflected by a portion of the pulse on the PDUP signal. The difference between the rising edge of a pulse on the PDUP signal and the corresponding rising edge of a pulse on the PDDN signal carries the phase information. This difference is determined by the difference in time (i.e., phase) between the rising edge of REF and the rising edge of FBC. This is illustrated in FIG. 4A by arrows 402 and 403.

In FIG. 4A, the pulse on the PDUP signal is output three times on the signal PMUP. Likewise, the pulse on the PDDN signal is output three times on the signal PMDN. Thus, the difference in time between the rising edges of the PDUP and PDDN signals (phase information) is output three times. This is an example number of replications. The pass-through and/or replication of the pulses on the PDUP signal is illustrated in FIG. 4A by arrows 404-406. The pass-through and/or replication of the pulses on the PDDN signal is illustrated in FIG. 4A by arrows 407-409.

Figure 4B:
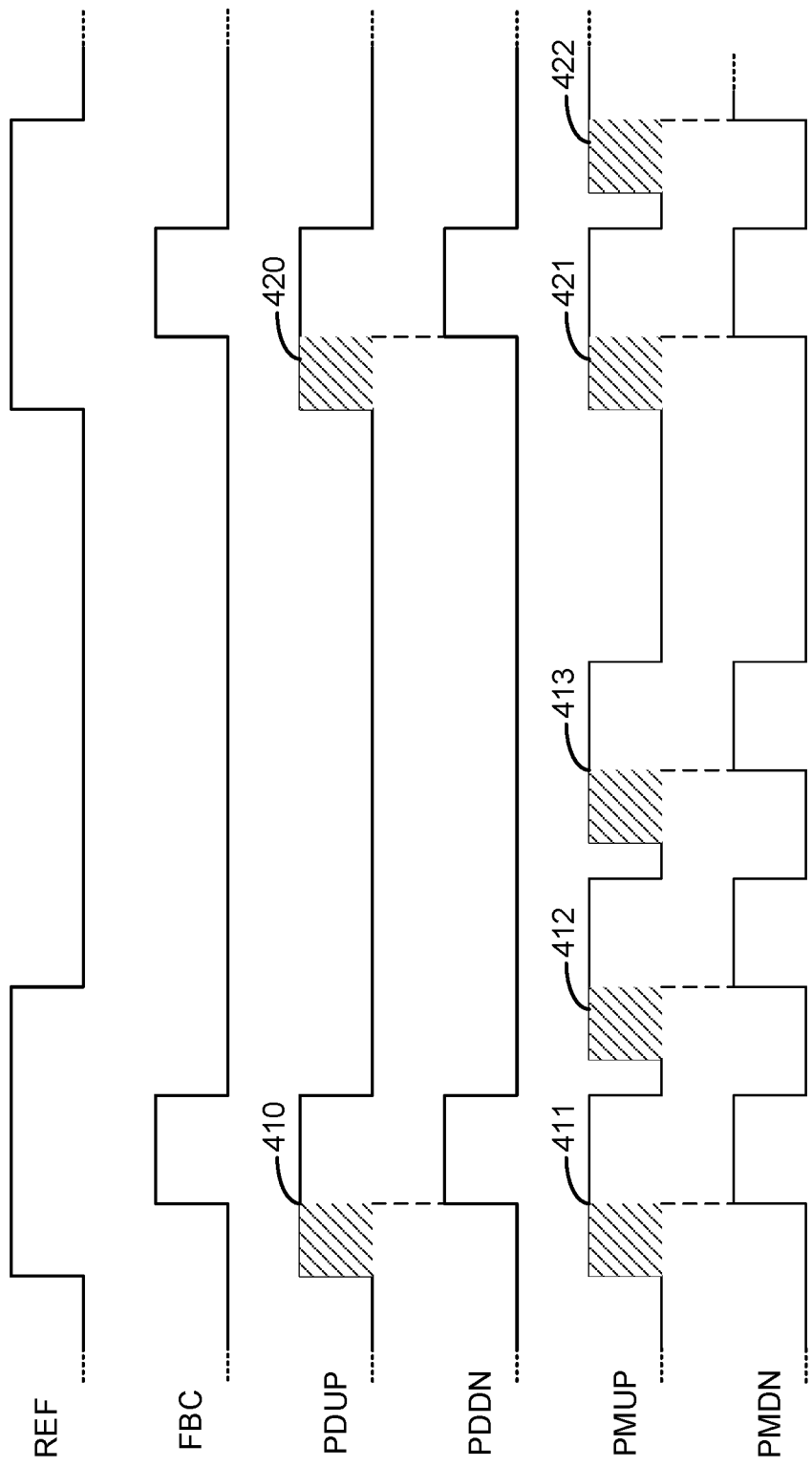
FIG. 4B is a waveform illustration multiplied phase information.

The replication of the phase information is further illustrated in FIG. 4B. FIG. 4B is a waveform illustration multiplied phase information. FIG. 4B has the same waveform relationships as FIG. 4A. However, the difference in time between the rising edges of the PDUP and PDDN signals (phase information) is emphasized by areas 410, 411, and 420. Likewise, the difference in time (multiplied phase information) between the rising edges of the pulses on the PMUP and PMDN signals is emphasized by areas 411-413 and 421-422.

Figure 5A:
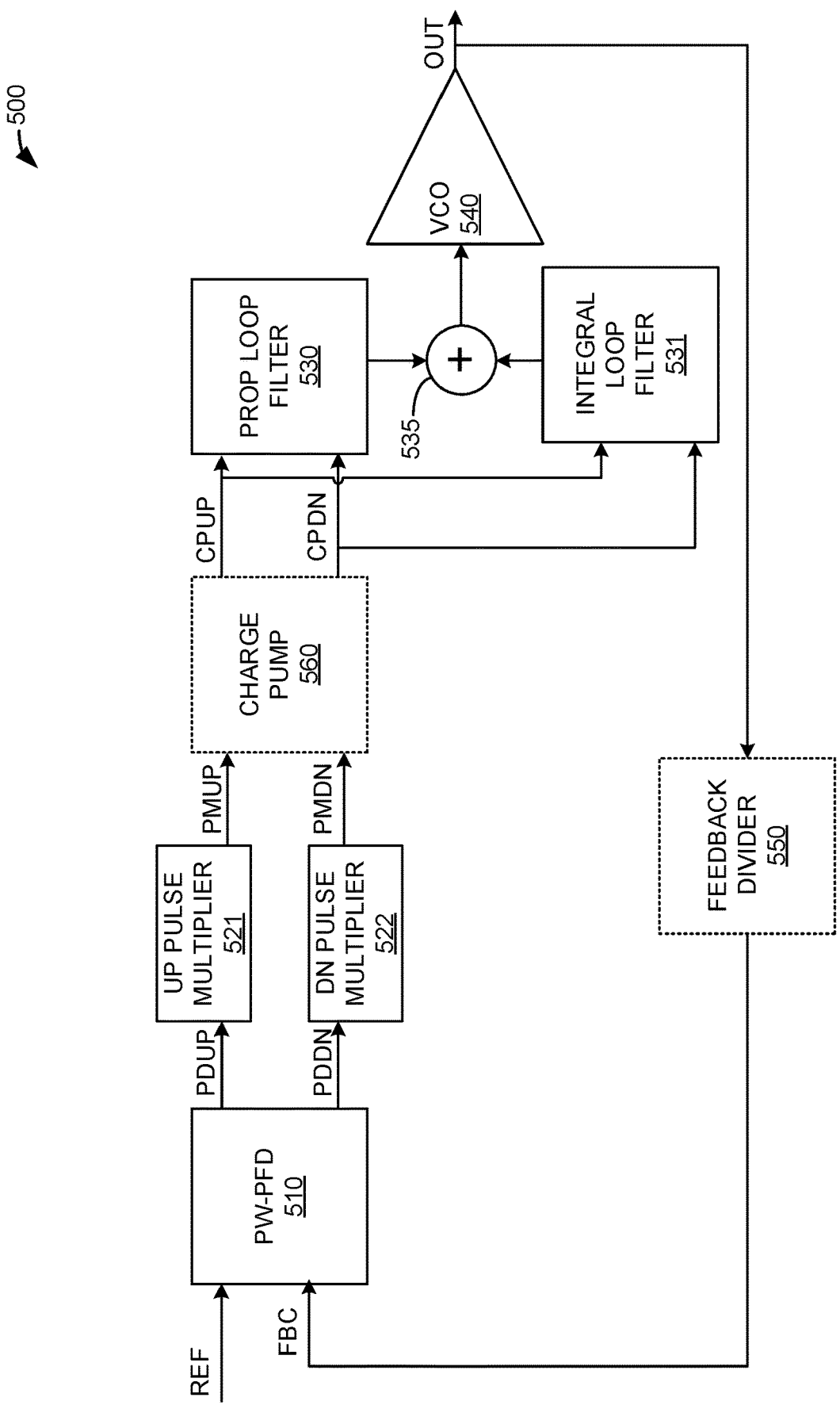
FIG. 5A is a block diagram illustrating a first proportional-integral (PI) phase-locked loop configuration with phase information multiplication.

FIG. 5A is a block diagram illustrating a first proportional-integral phase-locked loop configuration with phase information multiplication. In FIG. 5A, phase-locked loop configuration 500 comprises pulse-width output phase-frequency detector (PW-PFD or PFD) 510, up pulse multiplier (PM) 521, down pulse multiplier 522, proportional loop filter (LF) 530, integral loop filter 531, summing operation 535, voltage-controlled oscillator (VCO) 540, (optionally) feedback divider 550, and (optionally) charge pump 560.

Pulse-width phase-frequency detector 510 receives a reference signal (REF) and a feedback compare signal (FBC). PW-PFD 510 operates to compare the phase of the reference signal (REF) to the feedback compare signal (FBC) and, based on that comparison, generate signals PDUP and PDDN that correspond the difference in phase between the two signals (i.e., PDUP and PDDN, collectively convey the magnitude of phase difference and direction of phase difference—i.e., early or late). In an embodiment, PW-PFD 510 outputs digital pulses that convey information about the phase difference between the input reference signal (REF) and the feedback compare signal (FBC).

The pulses output by PW-PFD 510 are carried on PDUP and PDDN. For example, when the reference signal (REF) is earlier than the feedback compare signal (FBC), PW-PFD 510 will output at least one pulse on the PDUP signal that leads (or is longer than, or both) the pulse on the PDDN by an amount that is equal to, or proportional to, or corresponds to, the amount of time the reference signal (REF) leads the feedback compare signal (FBC). Likewise, when the reference signal (REF) is later than the feedback compare signal (FBC), PW-PFD 510 will output at least one pulse on the PDDN signal that leads (or is longer than, or both) the pulse on the PDUP by an amount that is equal to, or proportional to, or corresponds to, the amount of time the reference signal (REF) lags the feedback compare signal (FBC). Thus, PW-PFD 510 outputs pulses on PDUP and PDDN that convey information corresponding to the phase difference between the reference signal (REF) the feedback compare signal (FBC).

In an embodiment, the pulses on both signals PDUP and PDDN may have a minimum pulse width, and extra width is added to one of them to indicate the phase difference and lag/lead. Thus, in this embodiment, the phase difference is conveyed by the difference between the two pulse widths. In other words, PW-PFD 510 outputs pulses on PDUP and PDDN whose lengths convey the phase difference between the reference signal (REF) the feedback compare signal (FBC)—but are not equal to the amount of phase difference. The phase difference is conveyed by the difference between the two pulse widths on PDUP and PDDN. In another embodiment where there is no minimum pulse width on PDUP and PDDN, the signal the pulses appear on, PDUP or PDDN, may convey the direction (early or late) of the phase difference.

For example, if a particular edge of the reference signal (REF) arrives at PW-PFD 510 an amount of time ($\Delta T$) before the corresponding edge of the feedback compare signal (FBC), PW-PFD 510 may output a pulse that is (effectively) the same amount of time, $\Delta T$ on PDUP (or a minimum length pulse that is increased by $\Delta T$.) Thus, the earlier the reference signal (REF) arrives when compared to the feedback compare signal (FBC), the longer the pulse that is output by PW-PFD 510 on PDUP. Likewise, if a particular edge of the reference signal (REF) arrives at PW-PFD 510 an amount of time ($\Delta T$) after the corresponding edge of the feedback compare signal (FBC), PW-PFD 510 may output a pulse that is (effectively) the same amount of time, $\Delta T$ on PDDN (or a minimum length pulse that is increased by $\Delta T$.) Thus, the later the reference signal (REF) arrives when compared to the feedback compare signal (FBC), the longer the pulse that is output by PW-PFD 510 on PDDN. Accordingly, in this example, the length of the pulses output by PW-PFD 510 on PDUP and PDDN convey information about the amount of phase difference between REF and FBC.

The PDUP phase-detector output signal is input to up pulse multiplier 521. Up pulse multiplier 521 duplicates and offsets in time the pulses on PDUP output by phase-frequency detector 510. Up pulse multiplier 521 duplicates the digital pulses on PDUP output by phase-frequency detector 510 and offsets the duplicates (or optionally the originals) in time from the original pulses such that the duplicated pulses on PDUP do not overlap with the original (input) pulses, other duplicated pulses on PDUP, or the next PDUP pulse to be output by phase-frequency detector 510.

Likewise, The PDDN phase-detector output signal is input to down pulse multiplier 522. Down pulse multiplier 522 duplicates and offsets in time the pulses on PDDN output by phase-frequency detector 510. Down pulse multiplier 522 duplicates the digital pulses on PDDN output by phase-frequency detector 510 and offsets the duplicates (or optionally the originals) in time from the original pulses such that the duplicated pulses on PDDN do not overlap with the original (input) pulses, other duplicated pulses on PDDN, or the next PDDN pulse to be output by phase-frequency detector 510.

The pulses output by up pulse multiplier 521 are carried on one or more up pulse multiplier output (PMUP) signals. By multiplying the up direction digital pulses output by phase-frequency detector 510, the effect of the phase information carried by a single up direction pulse is likewise multiplied. This can effectively increase the proportional gain of the PLL 500 feedback loop without necessarily requiring modification of other components.

Likewise, the pulses output by down pulse multiplier 522 are carried on one or more down pulse multiplier output (PMDN) signals. By multiplying the down direction digital pulses output by phase-frequency detector 510, the effect of the phase information carried by a single down direction pulse is likewise multiplied. This effectively increases the proportional gain of the PLL 500 feedback loop without modifying the other components.

The pulse multiplier output pulses on PMUP and PMDN are provided to charge pump 560, if present. The outputs of charge pump 560 (CPUP, CPDN), if present, are provided to proportional loop filter 530 and integral loop filter 531. Charge pump 560 receives the pulses output by up pulse multiplier 521 and down pulse multiplier 522. Charge pump 560 converts the pulses on PMUP and PMDN to currents and/or voltages on CPUP and CPDN that are suitable for loop filter 530 and integral loop filter 531. If charge pump 560 is not present, pulse multiplier output pulses on PMUP and PMDN are provided directly to proportional loop filter 530 and integral loop filter 531. Thus, if charge pump 560 is not present, loop filter 530 and integral loop filter 531 are adapted (e.g., by using digital logic, an internal charge pump, switched capacitors, digital filtering, etc.) to receive the pulses from up pulse multiplier 521 and down pulse multiplier 522 directly. The output of loop filter 530 is summed with the output of integral loop filter 531 to produce one or more signals that control the frequency of the signal (OUT) output by VCO 540. In an embodiment, loop filter 530 and/or integral loop filter 531 may be part of VCO 540. The output of VCO 540 (OUT) is typically the output of phase-locked loop configuration 500.

VCO 540 may comprise voltage controlled capacitors that are part of an inductance-capacitance resonant circuit (a.k.a., LC circuit, LC tank circuit, LC tuned circuit, etc.) The bias voltage on one or more voltage controlled capacitors of VCO 540 may be based on the signals received from summing operation 535.

VCO 540 may comprise capacitors that are selectively switched in and out of an inductance-capacitance resonant circuit. These capacitors may be selectively switched in to, and out of, the inductance-capacitance resonant circuit based on digital control signals. These digital control signals may be based on one or more analog and/or digital values received from loop filter summing operation 535.

The output of VCO 540 (OUT) is fed back to the input of phase-frequency detector 510. Optionally, the frequency of the output of VCO 540 may be divided down to a lower frequency by feedback divider 550. The output of feedback divider 550, when present, is feedback compare signal, FBC. When feedback divider 550 divides by 1, the frequency of FBC is the same as the frequency of OUT. When feedback divider 550 is not present at all, the feedback compare signal FBC is also the output of VCO 540 (OUT).

Figure 5B:
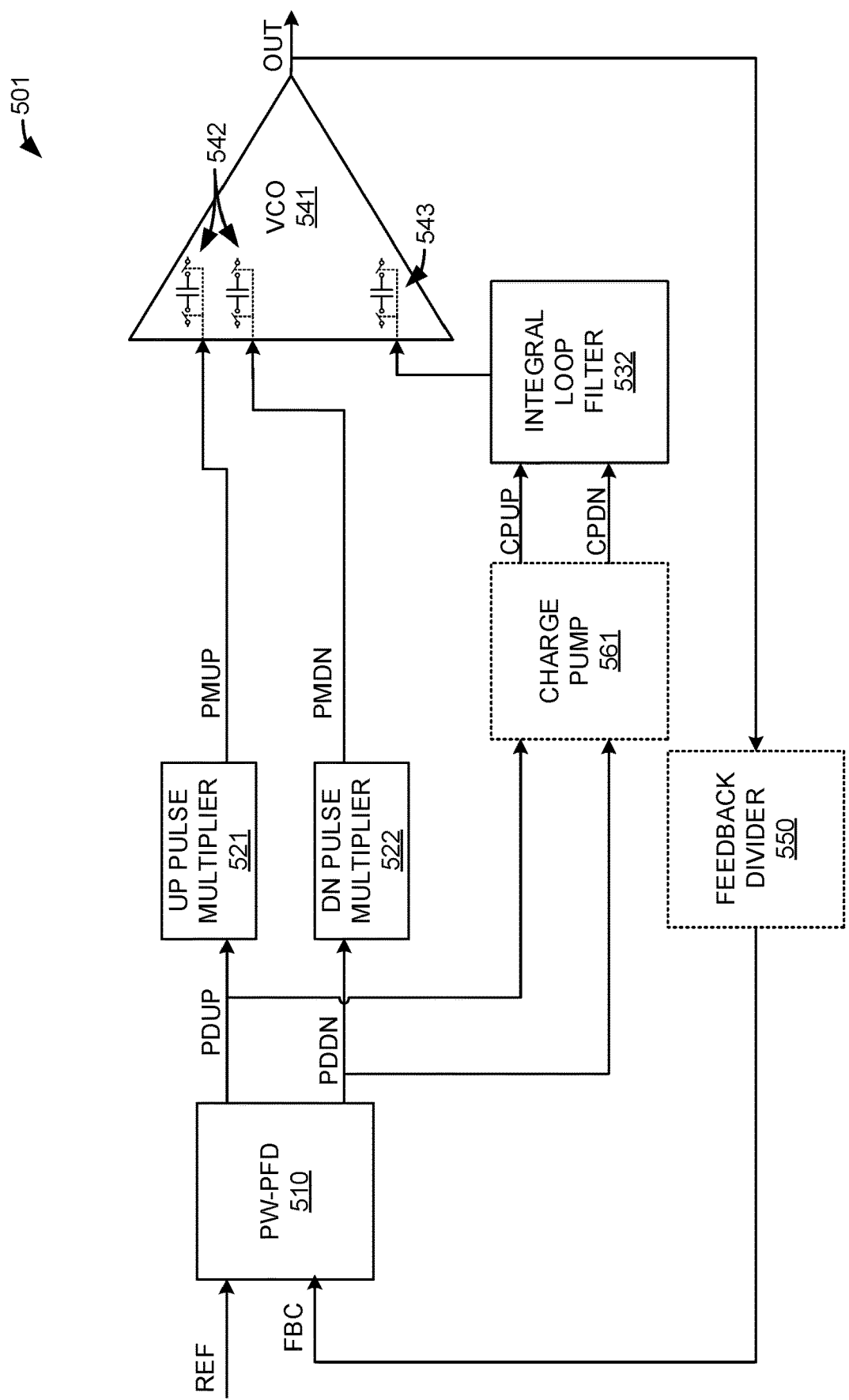
FIG. 5B is a block diagram illustrating a second proportional-integral (PI) phase-locked loop configuration with phase information multiplication.

FIG. 5B is a block diagram illustrating a second proportional-integral phase-locked loop configuration with phase information multiplication. In FIG. 5B, phase-locked loop configuration 501 comprises pulse-width output phase-frequency detector (PW-PFD or PFD) 510, up pulse multiplier (PM) 521, down pulse multiplier 522, integral loop filter 532, voltage-controlled oscillator (VCO) 541, (optionally) feedback divider 550, and (optionally) charge pump 561. VCO 541 includes capacitors 542 and capacitors 543 that may be selectively switched in to, and out of, or biased in, an inductance-capacitance resonant circuit to determine the frequency of the output of VCO 541.

Pulse-width phase-frequency detector 510 receives a reference signal (REF) and a feedback compare signal (FBC). PW-PFD 510 operates to compare the phase of the reference signal (REF) to the feedback compare signal (FBC) and, based on that comparison, generate signals PDUP and PDDN that correspond the difference in phase between the two signals (i.e., PDUP and PDDN, collectively convey the magnitude of phase difference and direction of phase difference—i.e., early or late). In an embodiment, PW-PFD 510 outputs digital pulses that convey information about the phase difference between the input reference signal (REF) and the feedback compare signal (FBC).

The pulses output by PW-PFD 510 are carried on PDUP and PDDN. For example, when the reference signal (REF) is earlier than the feedback compare signal (FBC), PW-PFD 510 will output at least one pulse on the PDUP signal that leads (or is longer than, or both) the pulse on the PDDN by an amount that is equal to, or proportional to, or corresponds to, the amount of time the reference signal (REF) leads the feedback compare signal (FBC). Likewise, when the reference signal (REF) is later than the feedback compare signal (FBC), PW-PFD 510 will output at least one pulse on the PDDN signal that leads (or is longer than, or both) the pulse on the PDUP by an amount that is equal to, or proportional to, or corresponds to, the amount of time the reference signal (REF) lags the feedback compare signal (FBC). Thus, PW-PFD 510 outputs pulses on PDUP and PDDN that convey information corresponding to the phase difference between the reference signal (REF) the feedback compare signal (FBC).

In an embodiment, the pulses on both signals PDUP and PDDN may have a minimum pulse width, and extra width is added to one of them to indicate the phase difference and lag/lead. Thus, in this embodiment, the phase difference is conveyed by the difference between the two pulse widths. In other words, PW-PFD 510 outputs pulses on PDUP and PDDN whose lengths convey the phase difference between the reference signal (REF) the feedback compare signal (FBC)—but are not equal to the amount of phase difference. The phase difference is conveyed by the difference between the two pulse widths on PDUP and PDDN. In another embodiment where there is no minimum pulse width on PDUP and PDDN, the signal the pulses appear on, PDUP or PDDN, may convey the direction (early or late) of the phase difference.

For example, if a particular edge of the reference signal (REF) arrives at PW-PFD 510 an amount of time ($\Delta T$) before the corresponding edge of the feedback compare signal (FBC), PW-PFD 510 may output a pulse that is (effectively) the same amount of time, $\Delta T$ on PDUP (or a minimum length pulse that is increased by $\Delta T$.) Thus, the earlier the reference signal (REF) arrives when compared to the feedback compare signal (FBC), the longer the pulse that is output by PW-PFD 510 on PDUP. Likewise, if a particular edge of the reference signal (REF) arrives at PW-PFD 510 an amount of time ($\Delta T$) after the corresponding edge of the feedback compare signal (FBC), PW-PFD 510 may output a pulse that is (effectively) the same amount of time, $\Delta T$ on PDDN (or a minimum length pulse that is increased by $\Delta T$.) Thus, the later the reference signal (REF) arrives when compared to the feedback compare signal (FBC), the longer the pulse that is output by PW-PFD 510 on PDDN. Accordingly, in this example, the length of the pulses output by PW-PFD 510 on PDUP and PDDN convey information about the amount of phase difference between REF and FBC.

The PDUP phase-detector output signal is input to up pulse multiplier 521. Up pulse multiplier 521 duplicates and offsets in time the pulses on PDUP output by phase-frequency detector 510. Up pulse multiplier 521 duplicates the digital pulses on PDUP output by phase-frequency detector 510 and offsets the duplicates (or optionally the originals) in time from the original pulses such that the duplicated pulses on PDUP do not overlap with the original (input) pulses, other duplicated pulses on PDUP, or the next PDUP pulse to be output by phase-frequency detector 510.

Likewise, The PDDN phase-detector output signal is input to down pulse multiplier 522. Down pulse multiplier 522 duplicates and offsets in time the pulses on PDDN output by phase-frequency detector 510. Down pulse multiplier 522 duplicates the digital pulses on PDDN output by phase-frequency detector 510 and offsets the duplicates (or optionally the originals) in time from the original pulses such that the duplicated pulses on PDDN do not overlap with the original (input) pulses, other duplicated pulses on PDDN, or the next PDDN pulse to be output by phase-frequency detector 510.

The pulses output by up pulse multiplier 521 are carried on one or more up pulse multiplier output (PMUP) signals. By multiplying the up direction digital pulses output by phase-frequency detector 510, the effect of the phase information carried by a single up direction pulse is likewise multiplied. This effectively increases the proportional gain of the PLL 501 feedback loop without modifying the other components.

Likewise, the pulses output by down pulse multiplier 522 are carried on one or more down pulse multiplier output (PMDN) signals. By multiplying the down direction digital pulses output by phase-frequency detector 510, the effect of the phase information carried by a single down direction pulse is likewise multiplied. This effectively increases the proportional gain of the PLL 501 feedback loop without modifying the other components.

The pulse multiplier output pulses on PMUP and PMDN are provided to capacitors 542 of VCO 541. PW-PFD 510 outputs PDUP and PDDN are provided to charge pump 561, if present. The outputs of charge pump 561 (CPUP, CPDN), if present, are provided to integral loop filter 532. Charge pump 561 receives the pulses output by PW-PFD 510. Charge pump 561 converts the pulses on PDUP and PDDN to currents and/or voltages on CPUP and CPDN that are suitable for integral loop filter 532. If charge pump 560 is not present, the PW-PFD outputs PDUP and PDDN are provided directly to integral loop filter 532. Thus, if charge pump 561 is not present, integral loop filter 532 is adapted (e.g., by using digital logic, an internal charge pump, switched capacitors, digital filtering, etc.) to receive the pulses from PW-PFD 510 directly. The pulses on PMUP and PMDN control the frequency of the signal (OUT) output by VCO 541 by determining which (and how many) of capacitors 542 are selectively switched in to, and out of, the inductance-capacitance resonant circuit that determines the frequency of the output of VCO 541. Likewise, the output of integral loop filter 532 determines which (and how many) of capacitors 543 are selectively switched in to, and out of, or biased in, the inductance-capacitance resonant circuit that determines the frequency of the output of VCO 541. The output of VCO 541 (OUT) is typically the output of phase-locked loop configuration 501.

The output of VCO 541 (OUT) is fed back to the input of phase-frequency detector 510. Optionally, the frequency of the output of VCO 541 may be divided down to a lower frequency by feedback divider 550. The output of feedback divider 550, when present, is feedback compare signal, FBC. When feedback divider 550 divides by 1, the frequency of FBC is the same as the frequency of OUT. When feedback divider 550 is not present at all, the feedback compare signal FBC is also the output of VCO 541 (OUT).

Figure 5C:
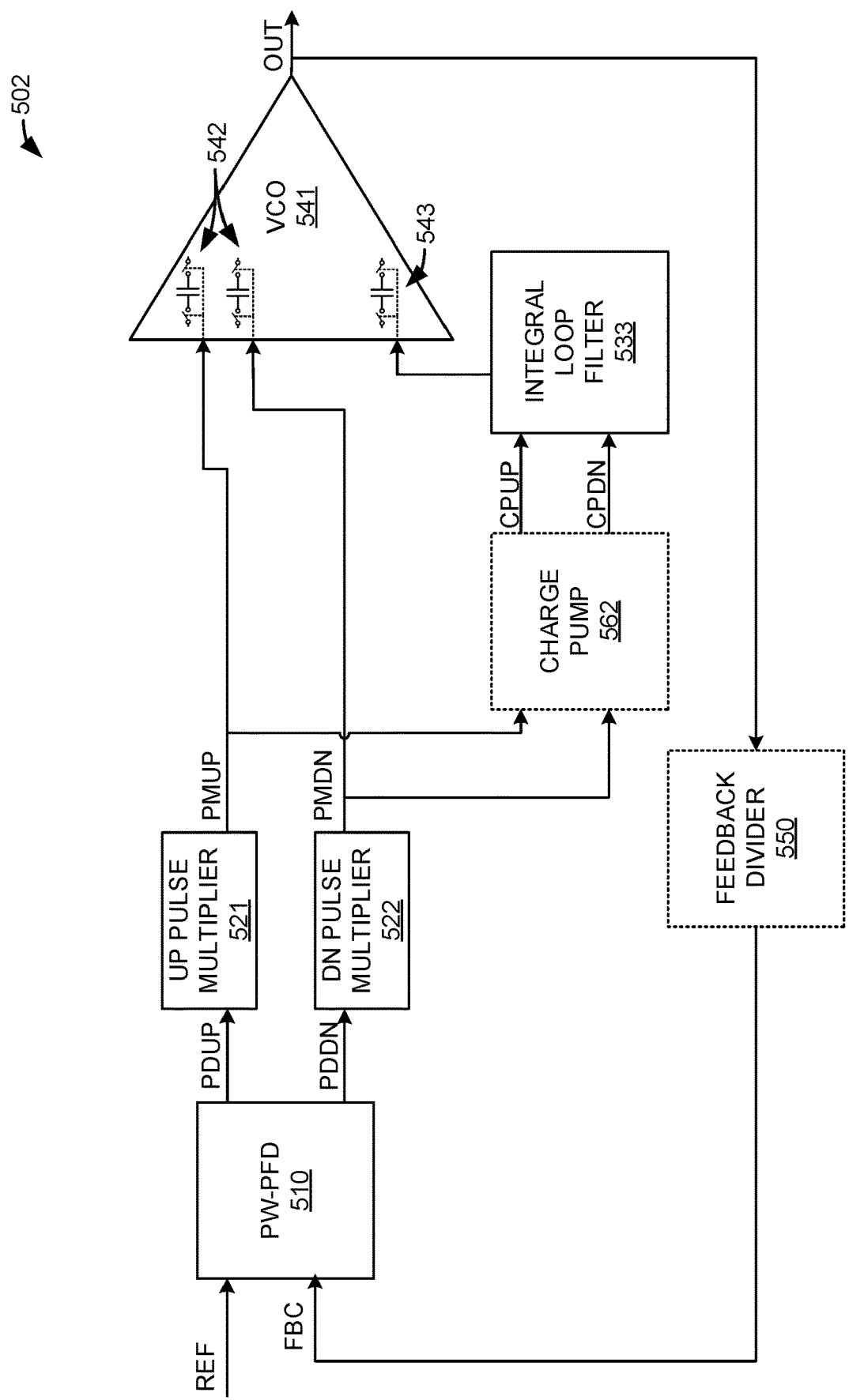
FIG. 5C is a block diagram illustrating a third proportional-integral (PI) phase-locked loop configuration with phase information multiplication.

FIG. 5C is a block diagram illustrating a third proportional-integral phase-locked loop configuration with phase information multiplication. In FIG. 5C, phase-locked loop configuration 502 comprises pulse-width output phase-frequency detector (PW-PFD or PFD) 510, up pulse multiplier (PM) 521, down pulse multiplier 522, integral loop filter 533, voltage-controlled oscillator (VCO) 541, (optionally) feedback divider 550, and (optionally) charge pump 562. VCO 541 includes capacitors 542 and capacitors 543 that may be selectively switched in to, and out of, or biased in, an inductance-capacitance resonant circuit to determine the frequency of the output of VCO 541.

Pulse-width phase-frequency detector 510 receives a reference signal (REF) and a feedback compare signal (FBC). PW-PFD 510 operates to compare the phase of the reference signal (REF) to the feedback compare signal (FBC) and, based on that comparison, generate signals PDUP and PDDN that correspond the difference in phase between the two signals (i.e., PDUP and PDDN, collectively convey the magnitude of phase difference and direction of phase difference—i.e., early or late). In an embodiment, PW-PFD 510 outputs digital pulses that convey information about the phase difference between the input reference signal (REF) and the feedback compare signal (FBC).

The pulses output by PW-PFD 510 are carried on PDUP and PDDN. For example, when the reference signal (REF) is earlier than the feedback compare signal (FBC), PW-PFD 510 will output at least one pulse on the PDUP signal that leads (or is longer than, or both) the pulse on the PDDN by an amount that is equal to, or proportional to, or corresponds to, the amount of time the reference signal (REF) leads the feedback compare signal (FBC). Likewise, when the reference signal (REF) is later than the feedback compare signal (FBC), PW-PFD 510 will output at least one pulse on the PDDN signal that leads (or is longer than, or both) the pulse on the PDUP by an amount that is equal to, or proportional to, or corresponds to, the amount of time the reference signal (REF) lags the feedback compare signal (FBC). Thus, PW-PFD 510 outputs pulses on PDUP and PDDN that convey information corresponding to the phase difference between the reference signal (REF) the feedback compare signal (FBC).

In an embodiment, the pulses on both signals PDUP and PDDN may have a minimum pulse width, and extra width is added to one of them to indicate the phase difference and lag/lead. Thus, in this embodiment, the phase difference is conveyed by the difference between the two pulse widths. In other words, PW-PFD 510 outputs pulses on PDUP and PDDN whose lengths convey the phase difference between the reference signal (REF) the feedback compare signal (FBC)—but are not equal to the amount of phase difference. The phase difference is conveyed by the difference between the two pulse widths on PDUP and PDDN. In another embodiment where there is no minimum pulse width on PDUP and PDDN, the signal the pulses appear on, PDUP or PDDN, may convey the direction (early or late) of the phase difference.

For example, if a particular edge of the reference signal (REF) arrives at PW-PFD 510 an amount of time ($\Delta T$) before the corresponding edge of the feedback compare signal (FBC), PW-PFD 510 may output a pulse that is (effectively) the same amount of time, $\Delta T$ on PDUP (or a minimum length pulse that is increased by $\Delta T$.) Thus, the earlier the reference signal (REF) arrives when compared to the feedback compare signal (FBC), the longer the pulse that is output by PW-PFD 510 on PDUP. Likewise, if a particular edge of the reference signal (REF) arrives at PW-PFD 510 an amount of time ($\Delta T$) after the corresponding edge of the feedback compare signal (FBC), PW-PFD 510 may output a pulse that is (effectively) the same amount of time, $\Delta T$ on PDDN (or a minimum length pulse that is increased by $\Delta T$.) Thus, the later the reference signal (REF) arrives when compared to the feedback compare signal (FBC), the longer the pulse that is output by PW-PFD 510 on PDDN. Accordingly, in this example, the length of the pulses output by PW-PFD 510 on PDUP and PDDN convey information about the amount of phase difference between REF and FBC.

The PDUP phase-detector output signal is input to up pulse multiplier 521. Up pulse multiplier 521 duplicates and offsets in time the pulses on PDUP output by phase-frequency detector 510. Up pulse multiplier 521 duplicates the digital pulses on PDUP output by phase-frequency detector 510 and offsets the duplicates (or optionally the originals) in time from the original pulses such that the duplicated pulses on PDUP do not overlap with the original (input) pulses, other duplicated pulses on PDUP, or the next PDUP pulse to be output by phase-frequency detector 510.

Likewise, The PDDN phase-detector output signal is input to down pulse multiplier 522. Down pulse multiplier 522 duplicates and offsets in time the pulses on PDDN output by phase-frequency detector 510. Down pulse multiplier 522 duplicates the digital pulses on PDDN output by phase-frequency detector 510 and offsets the duplicates (or optionally the originals) in time from the original pulses such that the duplicated pulses on PDDN do not overlap with the original (input) pulses, other duplicated pulses on PDDN, or the next PDDN pulse to be output by phase-frequency detector 510.

The pulses output by up pulse multiplier 521 are carried on one or more up pulse multiplier output (PMUP) signals. By multiplying the up direction digital pulses output by phase-frequency detector 510, the effect of the phase information carried by a single up direction pulse is likewise multiplied. This effectively increases the proportional and integral gain of the PLL 502 feedback loop without modifying the other components.

Likewise, the pulses output by down pulse multiplier 522 are carried on one or more down pulse multiplier output (PMDN) signals. By multiplying the down direction digital pulses output by phase-frequency detector 510, the effect of the phase information carried by a single down direction pulse is likewise multiplied. This effectively increases the proportional and integral gain of the PLL 502 feedback loop without modifying the other components.

The pulse multiplier output pulses on PMUP and PMDN are provided to capacitors 542 of VCO 541. The pulse multiplier output pulses on PMUP and PMDN are provided to charge pump 562, if present. Charge pump 562 receives the pulses output by up pulse multiplier 521 and down pulse multiplier 522. Charge pump 562 converts the pulses on PMUP and PMDN to currents and/or voltages on CPUP and CPDN that are suitable for integral loop filter 533. The outputs of charge pump 562, if present, are provided to integral loop filter 533. If charge pump 562 is not present, the pulse multiplier output pulses on PMUP and PMDN are provided directly to integral loop filter 533. Thus, if charge pump 562 is not present, integral loop filter 533 is adapted (e.g., by using digital logic, an internal charge pump, switched capacitors, digital filtering, etc.) to receive the pulses from up pulse multiplier 521 and down pulse multiplier 522 directly. The pulses on PMUP and PMDN control the frequency of the signal (OUT) output by VCO 541 by determining which (and how many) of capacitors 542 are selectively switched in to, and out of, the inductance-capacitance resonant circuit that determines the frequency of the output of VCO 541. Likewise, the output of integral loop filter 533 determines which (and how many) of capacitors 543 are selectively switched in to, out of, or biased, in the inductance-capacitance resonant circuit that determines the frequency of the output of VCO 541. The output of VCO 541 (OUT) is typically the output of phase-locked loop configuration 502.

The output of VCO 541 (OUT) is fed back to the input of phase-frequency detector 510. Optionally, the frequency of the output of VCO 541 may be divided down to a lower frequency by feedback divider 550. The output of feedback divider 550, when present, is feedback compare signal, FBC. When feedback divider 550 divides by 1, the frequency of FBC is the same as the frequency of OUT. When feedback divider 550 is not present at all, the feedback compare signal FBC is also the output of VCO 541 (OUT).

Figure 6:
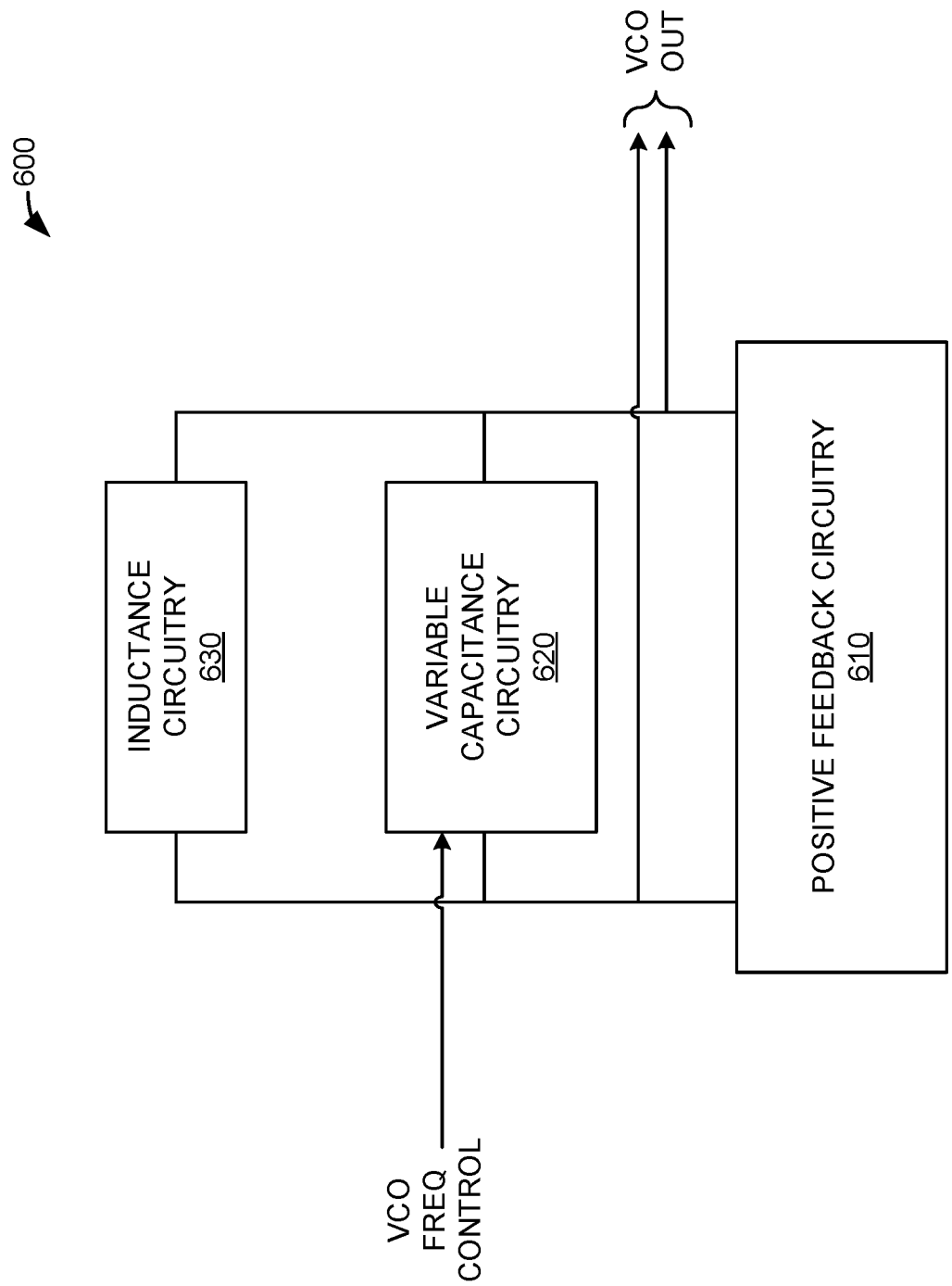
FIG. 6 is a block diagram illustrating an example inductance-capacitance (LC) voltage controlled oscillator.

FIG. 6 is a block diagram illustrating an example inductance-capacitance (LC) voltage controlled oscillator. Voltage controlled oscillator 600 may be used as, or be part of, VCO 140, VCO 340, VCO 540, and/or VCO 541. In FIG. 6, voltage controlled oscillator 600 comprises positive feedback circuitry 610, variable capacitance circuitry 620, and inductance circuitry 630. Inductance circuitry 630 may comprise an on-chip and/or an off-chip inductor. Variable capacitance circuitry 620 may comprise one or more voltage controlled capacitors. Variable capacitance circuitry 620 may comprise one or more voltage static capacitors that are switched in to, or out of, the capacitance presented by variable capacitance circuitry 620.

Variable capacitance circuitry 620 is in parallel with inductance circuitry 630 to form an inductance-capacitance resonant circuit. Positive feedback circuit 610 is connected to variable capacitance circuitry 620 and inductance circuitry 630 to maintain the oscillation of VCO 600. A frequency control input is received by variable capacitance circuitry 620. In response to changes to the frequency control input, the amount of capacitance provided by variable capacitance circuitry 620 to the inductance-capacitance resonant circuit is changed—thereby changing the frequency output by VCO 600.

Figure 7:
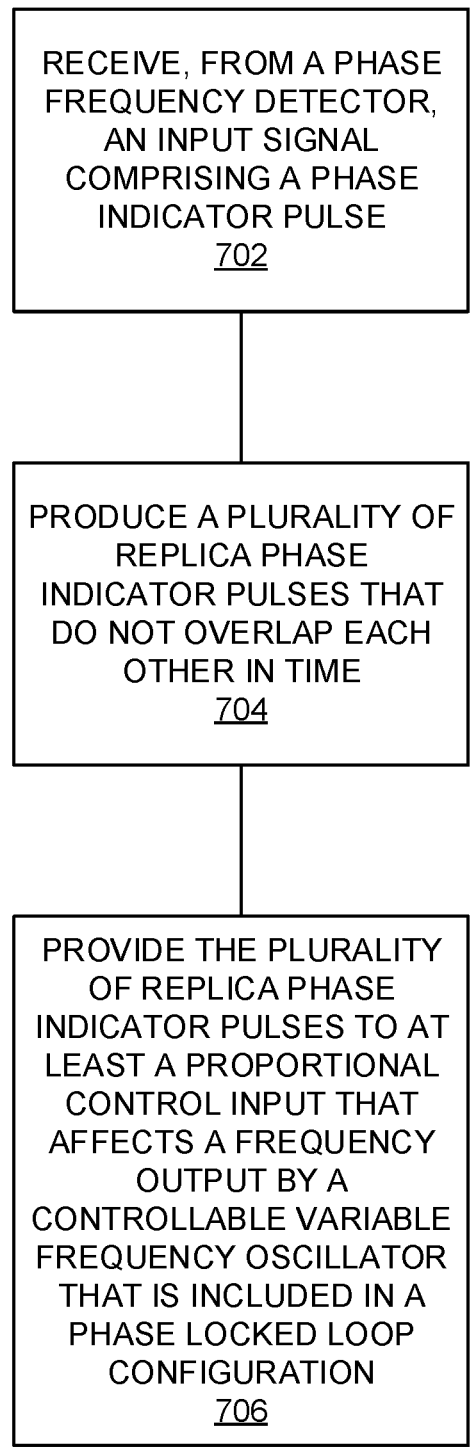
FIG. 7 is a flowchart illustrating a method of multiplying phase information in a phase-locked loop.

FIG. 7 is a flowchart illustrating a method of multiplying phase information in a phase-locked loop. The steps illustrated in FIG. 7 may be performed by one or more elements of phase-locked loop configuration 100, phase-locked loop configuration 300, and/or phase-locked loop configuration 500, 501 and 502. From a phase frequency detector, an input signal comprising a phase indicator pulse is received (702). For example, pulse multiplier 120 may receive a pulse with phase information from phase frequency detector 110. In another example, up pulse multiplier 321 and down pulse multiplier 322 may receive pulses whose relationship to each other (e.g., timing) convey phase information from phase frequency detector 310.

A plurality of replica phase indicator pulses that do not overlap each other in time are produced (704). For example, pulse multiplier 120 may replicate pulses received from phase frequency detector 110 at least two times. In another example, up pulse multiplier 321 and down multiplier 322 may replicate pulses received from phase frequency detector 310 at least two times.

The plurality of replica phase indicator pulses are provided to at least a proportional control input that affects a frequency output by a controllable variable frequency oscillator that is included in a phase locked loop configuration (706). For example, the replicated pulses output by pulse multiplier 120 may be provided to loop filter 130 which is coupled to control the frequency output by VCO 140. In another example, the pulses output by up pulse multiplier 321 and down multiplier 322 may be provided to (optionally present) charge pump 360 or (as appropriate) loop filter 330 which is coupled to control the frequency output by VCO 340. In another example, the pulses output by up pulse multiplier 521 and down multiplier 522 may be provided to proportional loop filter 530 which is coupled to affect the frequency output by VCO 540. In another example, the pulses output by pulse multiplier 521 and down multiplier 522 may be coupled directly to capacitors 542 to affect the frequency output of VCO 541, while the pulses output by PW-PFD 510 are provided to charge pump 561 and integral loop filter 532 and couple to capacitors 543 to affect the frequency output of VCO 541.

Figure 8:
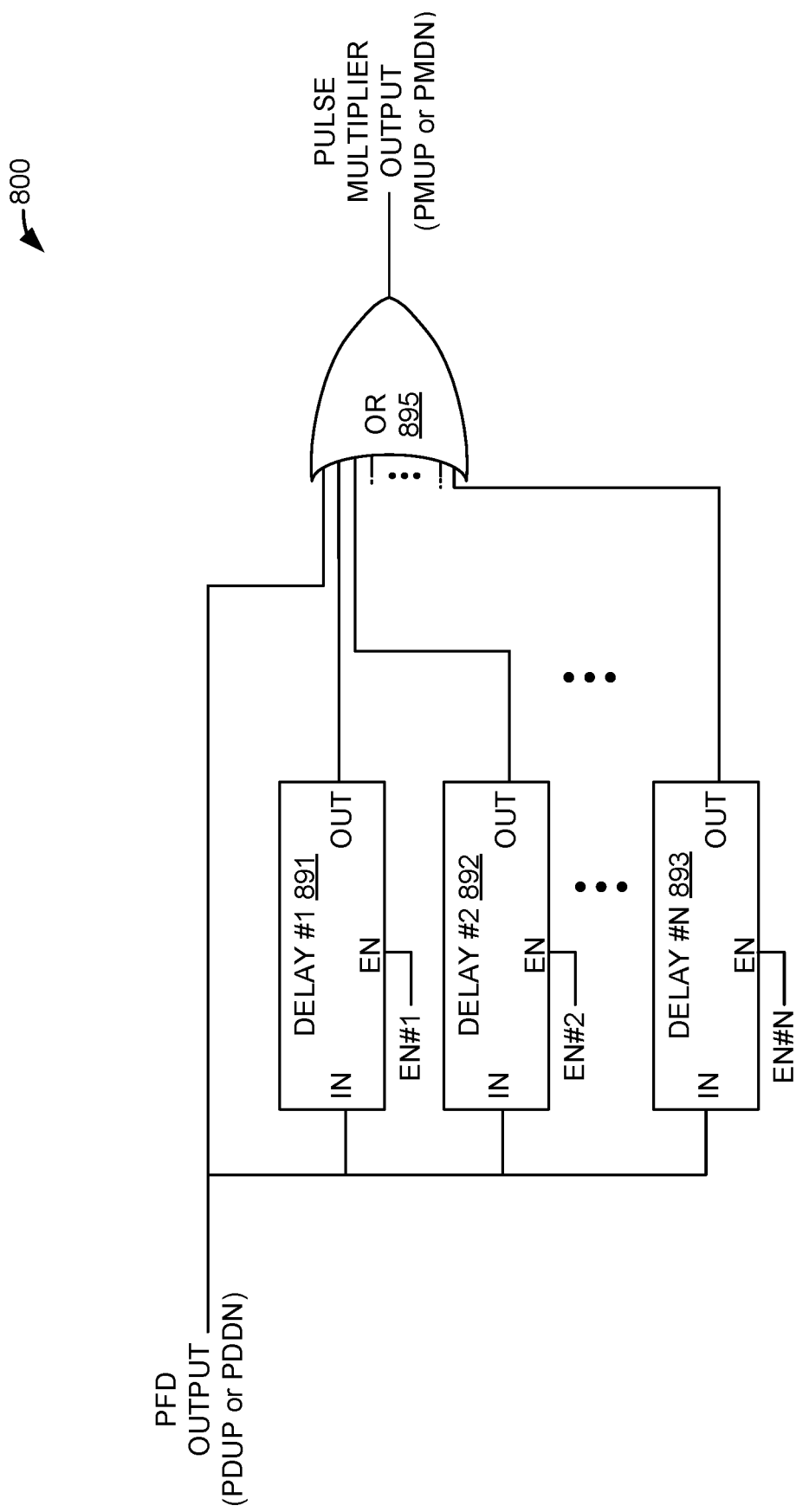
FIG. 8 is a schematic diagram illustrating an example pulse-multiplier.

FIG. 8 is a schematic diagram illustrating an example pulse-multiplier. Pulse multiplier 800 may be used as, or be part of, pulse multiplier 120, up pulse multiplier 321, down pulse multiplier 322, up pulse multiplier 521, and/or down pulse multiplier 522. In FIG. 8, pulse multiplier 800 comprises N number of delay elements 891-893, which may have fixed or adjustable delay, and OR gate 895. The input signal to be multiplied (e.g., PDUP or PDDN) is operatively coupled to a first input of OR gate 895. The input signal to be multiplied is also operatively coupled to the inputs of delay elements 891-893. Each of delay elements 891-893 has an enable input (EN) that controls whether that respective delay element will provide a delayed version of the signal at its input. This enable input allows the number of replicas provided by pulse multiplier 800 to be controlled. The outputs of delay elements 891-893 are provided to respective inputs of OR gate 895. The output of OR-gate 895 is also the output of pulse multiplier 800.

Figure 9:
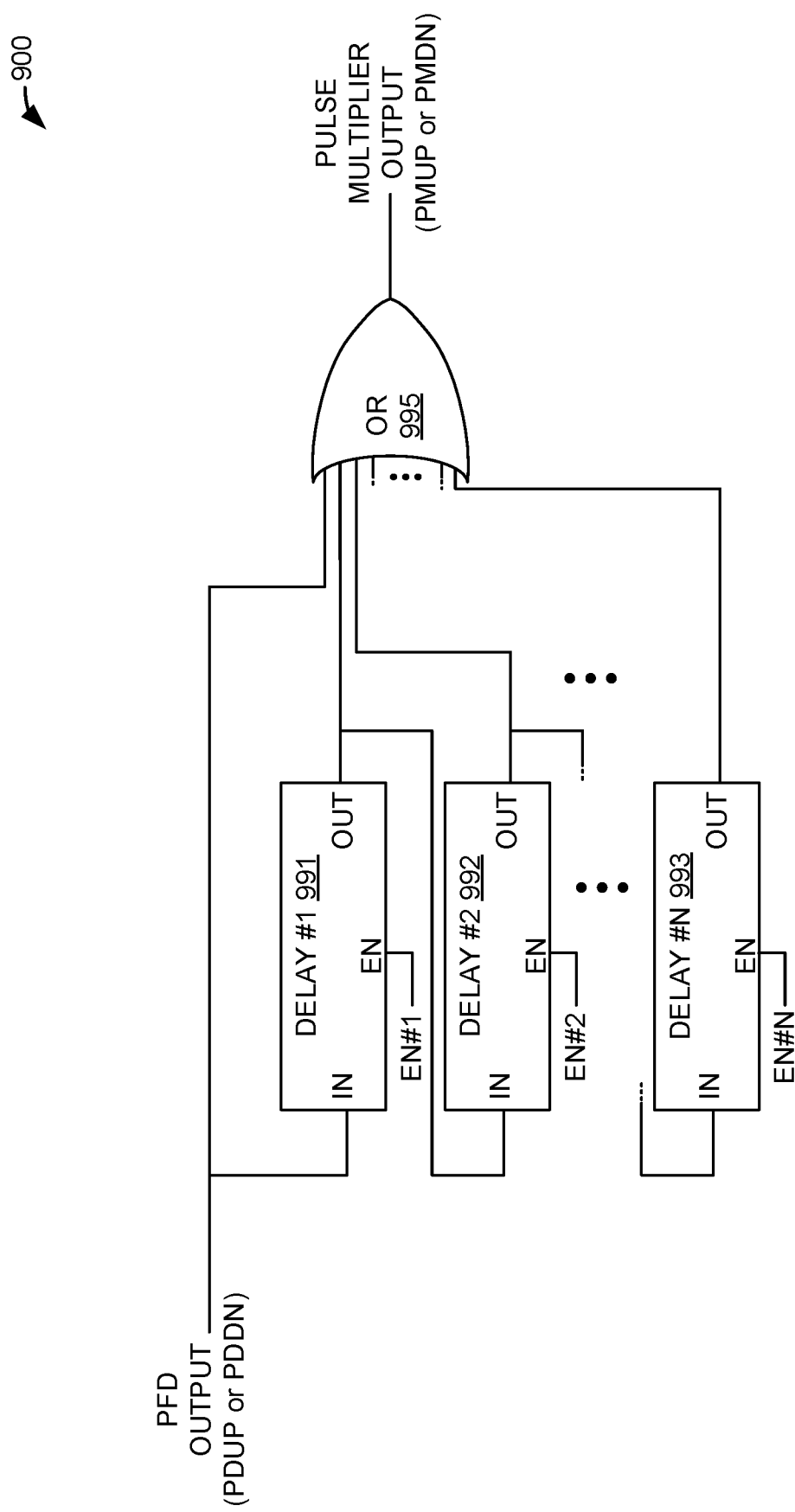
FIG. 9 is a schematic diagram illustrating second example of a pulse-multiplier.

FIG. 9 is a schematic diagram illustrating second example of a pulse-multiplier. Pulse multiplier 900 may be used as, or be part of, pulse multiplier 120, up pulse multiplier 321, down pulse multiplier 322, up pulse multiplier 521, and/or down pulse multiplier 522. In FIG. 9, pulse multiplier 900 comprises N number of delay elements 991-993, which may have fixed or adjustable delay, and OR gate 995. The input signal to be multiplied (e.g., PDUP or PDDN) is operatively coupled to a first input of OR gate 995. The input signal to be multiplied is also operatively coupled to the input of delay elements 991. The output of delay element 991 is operatively coupled to the input of delay element 992. The output of delay element 992 is input to the next delay element (not shown in FIG. 9), and so on in a daisy chain fashion. Each of delay elements 991-993 has an enable input (EN) that controls whether that respective delay element will provide a delayed version of the signal at its input. This enable input allows the number of replicas provided by pulse multiplier 900 to be controlled. The outputs of delay elements 991-993 are provided to respective inputs of OR gate 995. The output of OR-gate 995 is also the output of pulse multiplier 900.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited, to one or more elements of phase-locked loop configuration 100, phase-locked loop configuration 300, phase-locked loop configuration 500, phase-locked loop configuration 501, phase-locked loop configuration 502, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 10 mm magnetic tape, 3½ inch floppy media, CDs, DVDs, and so on.

Figure 10:
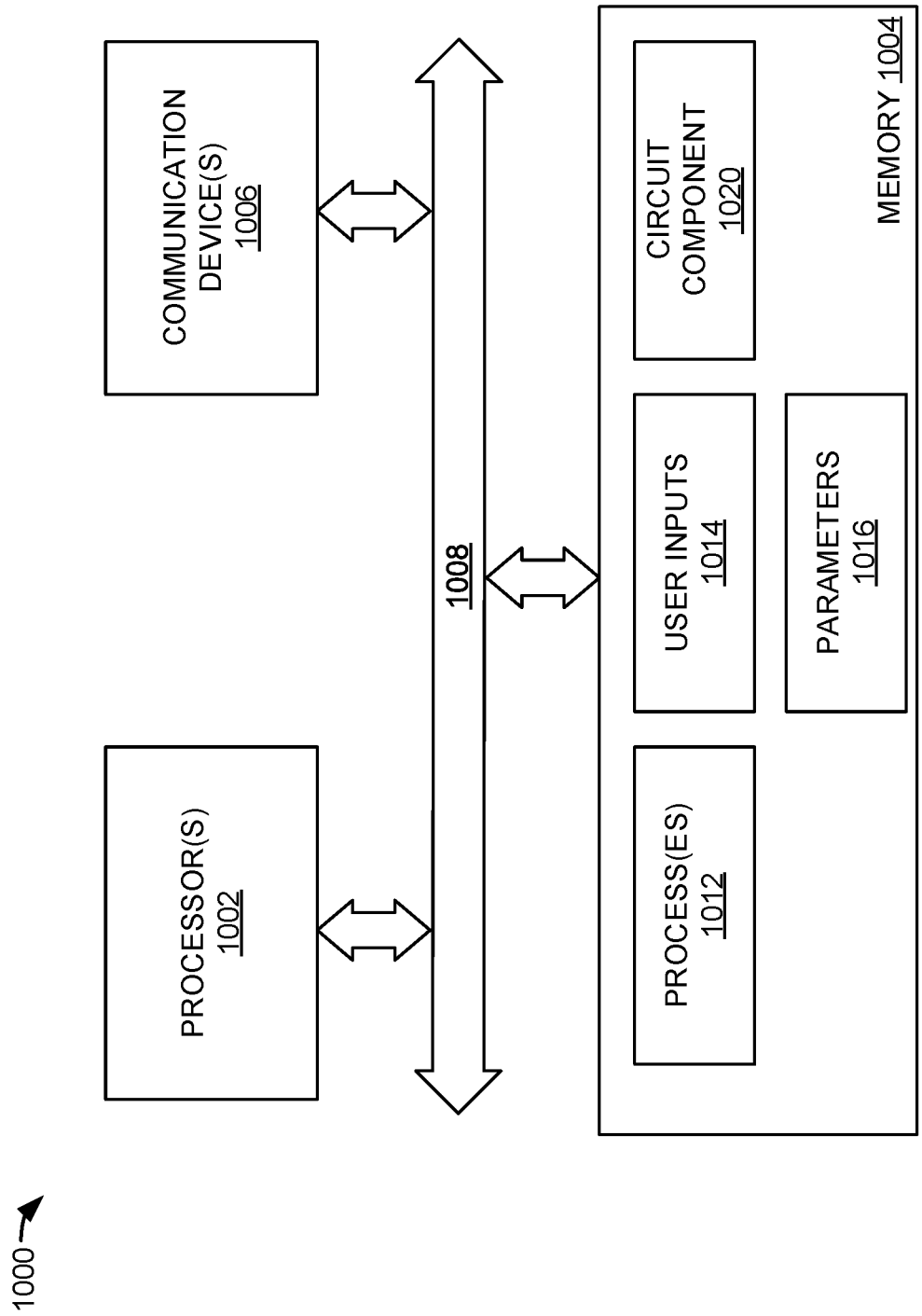
FIG. 10 is a block diagram of a processing system.

FIG. 10 is a block diagram illustrating one embodiment of a processing system 1000 for including, processing, or generating, a representation of a circuit component 1020. Processing system 1000 includes one or more processors 1002, a memory 1004, and one or more communications devices 1006. Processors 1002, memory 1004, and communications devices 1006 communicate using any suitable type, number, and/or configuration of wired and/or wireless connections 1008.

Processors 1002 execute instructions of one or more processes 1012 stored in a memory 1004 to process and/or generate circuit component 1020 responsive to user inputs 1014 and parameters 1016. Processes 1012 may be any suitable electronic design automation (EDA) tool or portion thereof used to design, simulate, analyze, and/or verify electronic circuitry and/or generate photomasks for electronic circuitry. Representation 1020 includes data that describes all or portions of phase-locked loop configuration 100, phase-locked loop configuration 300, phase-locked loop configuration 500, phase-locked loop configuration 501, phase-locked loop configuration 502, and their components, as shown in the Figures.

Representation 1020 may include one or more of behavioral, register transfer, logic component, transistor, and layout geometry-level descriptions. Moreover, representation 1020 may be stored on storage media or communicated by carrier waves.

Data formats in which representation 1020 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 1014 may comprise input parameters from a keyboard, mouse, voice recognition interface, microphone and speakers, graphical display, touch screen, or other type of user interface device. This user interface may be distributed among multiple interface devices. Parameters 1016 may include specifications and/or characteristics that are input to help define representation 1020. For example, parameters 1016 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 1004 includes any suitable type, number, and/or configuration of non-transitory computer-readable storage media that stores processes 1012, user inputs 1014, parameters 1016, and circuit component 1020.

Communications devices 1006 include any suitable type, number, and/or configuration of wired and/or wireless devices that transmit information from processing system 1000 to another processing or storage system (not shown) and/or receive information from another processing or storage system (not shown). For example, communications devices 1006 may transmit circuit component 1020 to another system. Communications devices 1006 may receive processes 1012, user inputs 1014, parameters 1016, and/or circuit component 1020 and cause processes 1012, user inputs 1014, parameters 1016, and/or circuit component 1020 to be stored in memory 1004.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. An integrated circuit, comprising:
an input to receive an input signal from a phase frequency detector;
a pulse multiplier circuit to multiply, in the time domain, pulses in the input signal from the phase frequency detector to produce a pulse multiplier output signal comprising a plurality of delayed versions of the input signal pulses, each of the plurality of delayed versions of the input signal pulses to be non-overlapping in time with other of the plurality of delayed versions of the input signal pulses;
an integral loop filter circuit to produce, based on the pulses in the input signal from the phase frequency detector, an integral loop filter output signal; and
a voltage controlled oscillator (VCO) to receive the pulse multiplier output signal and the integral loop filter output signal, the VCO comprising an inductance-capacitance resonant circuit that is to determine a frequency of an output of the VCO, the pulse multiplier output signal to determine which capacitors of a first set of capacitors are to be switched in to, and out of, the inductance-capacitance resonant circuit, the integral loop filter output signal to determine which capacitors of a second set of capacitors are to be switched in to, and out of, the inductance-capacitance resonant circuit.

2. The integrated circuit of claim 1, further comprising:
a plurality of controllable delay circuits to generate, in response to the at least two enable inputs, N number of delayed versions of the input signal pulses.

3. The integrated circuit of claim 2, further comprising:
a combiner circuit to receive the N number of delayed versions in parallel and to produce a serial pulse stream comprised of the N number of delayed versions of the input signal.

4. The integrated circuit of claim 1, wherein the phase frequency detector, the pulse multiplier circuit, the integral loop filter circuit, and the voltage controlled oscillator are used as part of a phase-locked loop circuit.

5. The integrated circuit of claim 4, wherein the voltage controlled oscillator is to comprise at least one inductor internal to the integrated circuit and at least one capacitor internal to the integrated circuit.

6. The integrated circuit of claim 4, wherein the phase-locked loop circuit further comprises an integral gain path coupled to the phase frequency detector.

7. The integrated circuit of claim, 6 further comprising:
a plurality of controllable, in response to the at least two enable inputs, delay stages coupled in series to each to produce a respective one of the plurality of delayed versions of the input signal pulses.

8. A phase locked loop circuit, comprising:
a controllable variable frequency oscillator to produce a variable frequency signal, the controllable variable frequency oscillator comprising an inductance-capacitance resonant circuit that is to determine a frequency of the variable frequency signal;
a phase frequency detector to receive a reference signal and a feedback signal, and to produce an output signal comprising a phase indicator pulse, the feedback signal to be derived from the variable frequency signal;
a proportional gain path to receive the phase indicator pulse and to provide a first control signal to the controllable variable frequency oscillator, the proportional gain path to include a pulse multiplier to produce, based on the phase indicator pulse, at least one replica version of the phase indicator pulse;
an integral gain path to receive the phase indicator pulse and to provide a second control signal to the controllable variable frequency oscillator;
the at least one replica version to be non-overlapping in time with the phase indicator pulse and to be non-overlapping in time with other of the at least one replica version;
the at least one replica version to be provided to a control input of the controllable variable frequency oscillator to determine which capacitors of a first set of capacitors are to be switched in to, and out of, the inductance-capacitance resonant circuit; and
the second control signal to determine which capacitors of a second set of capacitors are to be switched in to, and out of, the inductance-capacitance resonant circuit.

9. The phase locked loop circuit of claim 8, wherein the pulse multiplier produces N number of replica versions of the phase indicator pulse from each single phase indicator pulse, where N is an integer greater than one and N is determined by the at least one enable input.

10. The phase locked loop circuit of claim 9, wherein the N number of replica version of the phase indicator pulse are produced by a corresponding N number of delay circuits.

11. The phase locked loop circuit of claim 10, wherein the N number of delay circuits may each comprise a plurality of delay stage circuits.

12. The phase locked loop circuit of claim 9, wherein the pulse multiplier further comprises a pulse combiner to receive the N number of replica versions of the phase indicator pulse and to produce a serial pulse stream comprised of N number of replica versions of the input signal that do not overlap in time.

13. The phase locked loop circuit of claim 8, wherein the phase frequency detector and the pulse multiplier are included on an integrated circuit.

14. The phase locked loop of claim 13, wherein the controllable variable frequency oscillator is included on the integrated circuit.

15. A method of operating a portion of an integrated circuit, comprising:
receiving an input signal from a phase frequency detector, the input signal to comprise a phase indicator pulse;
producing a plurality of replica phase indicator pulses, each of the plurality of replica phase indicator pulses to not overlap in time with other of the plurality of replica phase indicator pulses;
providing the input signal from the phase frequency detector to an integral gain path to, based on the input signal from the phase frequency detector, generate an integral control signal;
providing the plurality of replica phase indicator pulses to at least a proportional control input that affects a frequency output by a controllable variable frequency oscillator that is part of a phase locked loop configuration, the controllable variable frequency oscillator comprising an inductance-capacitance resonant circuit that is to determine the frequency output by the controllable variable frequency oscillator, the plurality of replica phase indicator pulses to determine which capacitors of a first set of capacitors are to be switched in to, and out of, the inductance-capacitance resonant circuit; and
providing the integral control signal to an integral control input of the controllable variable frequency oscillator, the integral control signal to determine which capacitors of a second set of capacitors in the inductance-capacitance resonant circuit are to be biased.

16. The method of claim 15, wherein the controllable variable frequency oscillator is a voltage controlled oscillator.

17. The method of claim 15, wherein the controllable variable frequency oscillator is a current controlled oscillator.

18. The method of claim 15, wherein the phase frequency detector is provided a feedback signal derived from an output of the controllable variable frequency oscillator.

19. The method of claim 18, wherein the phase locked loop circuit further comprises an integral feedback path that receives the phase indicator pulse.

20. The method of claim 19, wherein the controllable variable frequency oscillator is included on the integrated circuit.

* * * * *